US006324089B1

(12) United States Patent
Symoen et al.

(10) Patent No.: US 6,324,089 B1
(45) Date of Patent: Nov. 27, 2001

(54) ACTUATORS REMOTELY CONTROLLED BY TRANSMITTERS POSSESSING AN IDENTITY NUMBER

(75) Inventors: Lionel Symoen, Passy; Jean-Marc Nicolas Vignoli, Thorens-Glieres, both of (FR)

(73) Assignee: Somfy, Cluses (FR)

( * ) Notice: Subject to any disclaimer, the term of this patent is extended or adjusted under 35 U.S.C. 154(b) by 0 days.

(21) Appl. No.: 09/549,978

(22) Filed: Apr. 14, 2000

(30) Foreign Application Priority Data

Apr. 16, 1999 (FR) ..... 99 04822

(51) Int. Cl.[7] ..... G11C 5/02
(52) U.S. Cl. ..... 365/52
(58) Field of Search ..... 365/52

(56) References Cited

U.S. PATENT DOCUMENTS 4,750,118 6/1988 Heitschel et al. .
5,473,758 * 12/1995 Allen et al. ..... 365/52

FOREIGN PATENT DOCUMENTS 42 42 231 6/1994 (DE) .
2 761 183 9/1998 (FR) .

OTHER PUBLICATIONS

Preliminary Search Report in SN/9904822.

* cited by examiner

*Primary Examiner*—Trong Phan
(74) *Attorney, Agent, or Firm*—Bugnion S.A.; John Moetteli

(57) ABSTRACT

An assembly comprising at least one device remotely controlled by at least one transmitter (ESA, ESB) possessing an identity number capable of transmitting a signal consisting of a frame containing the identity number (A, B) and a command and a receiver (R1, R2) which are associated with the remotely controlled device (VR1, VR2) and capable of extracting the identity number from the signal received and of storing it. At least one transmitter of the assembly is a transmitter of simple type, that is to say whose signal frame contains an identifier signifying that this transmitter may control only a single receiver and the program contained in the processor of at least one receiver contains a routine for testing and identifying the type of transmitter preventing the recording of additional transmitter identity numbers in the memory if the identity number identified is that of a transmitter of simple type. A transmitter can then control only a single receiver.

5 Claims, 2 Drawing Sheets

ACTUATORS REMOTELY CONTROLLED BY TRANSMITTERS POSSESSING AN IDENTITY NUMBER

BACKGROUND OF THE INVENTION

The invention relates to an assembly comprising at least one device remotely controlled by at least one transmitter possessing an identity number and capable of transmitting a signal consisting of a frame containing the identity number and a command, a receiver associated with the remotely Controlled device and capable of extracting the identity number and the command from the signal received, this receiver containing a logic processing unit comprising a memory intended for storing at least one identity number, a processor containing a recording program ensuring, on receiving an identity number, the storing of the identity number received if this identity number is not already recorded and the erasing of this identity number if it is already recorded, this microprocessor being able to work in an operational mode in which it compares the identity number received with the identity numbers contained in the memory so as to execute the command received when the identity number received corresponds to an identity number contained in the memory and in a recording mode in which it is able to ensure the recording of the identity number of the transmitter in the memory, the transmitter and the receiver comprising associated means for placing the processor in recording mode.

The remotely controlled devices are, for example, roller blinds, shutters, lighting means, air conditioning means or the like.

Such an assembly is known from the document FR-A-2 761 183, the content of which is incorporated by reference. This assembly allows the storing of the identity numbers of other transmitters in the memory of a receiver or the reconfiguring of the assembly by means of a transmitter known to the receiver, without intervening directly in the receiver, thereby minimizing the need for access to the receiver. This assembly represents not only a solution to the absence of access to the receiver, but also a considerable time saving.

SUMMARY OF THE INVENTION

In this assembly, a receiver can obey the commands from several transmitters whose identity numbers are registered in its memory. It may however be desired that a transmitter should be able to control one receiver only. To this end, it is necessary to make the receiver understand that it should not accept a command from another transmitter. The present invention is aimed precisely at solving this problem.

The assembly according to the invention is one wherein at least one transmitter of the assembly is a transmitter of the so-called simple type, that is to say a transmitter whose signal frame contains an identifier signifying that this transmitter may control only a single receiver, and wherein the program contained in the processor of at least one receiver contains a routine for testing and for identifying the type of transmitter preventing the recording of additional transmitter identity numbers in the memory if the identity number identified is that of a transmitter of simple type.

Any receiver having recorded the identity number of a transmitter of simple type will therefore not be able to be controlled by another transmitter, whether or not of simple type.

In such an assembly, one may however wish to be able to carry out a general control a posteriori, that is to say to control a receiver via several transmitters. To this end, according to one mode of execution of the invention, the assembly comprises at least one auxiliary remote control box associated with at least one transmitter, this auxiliary box making it possible to transmit a control signal whose reception by the receivers has the effect of deactivating the said routine and consequently of authorizing the recording of additional transmitter identity numbers in the memory in such as a way as to allow the recording of an identity number of a transmitter used as general control transmitter, the program contained in the processor of the receivers containing a routine for testing the reception of a signal emanating from an auxiliary box, deactivating the said routine on receiving such a signal.

The transmitter with which an auxiliary box is associated can be a transmitter of "standard" type or a transmitter of simple type.

In the absence of any deactivation signal, the routine for testing and identifying the type of transmitter is activated.

BRIEF DESCRIPTION OF THE DRAWINGS

The appended drawing represents, by way of example, a mode of execution of the invention.

DETAILED DESCRIPTION OF THE PREFERRED EMBODIMENT(S)

Figure 1:
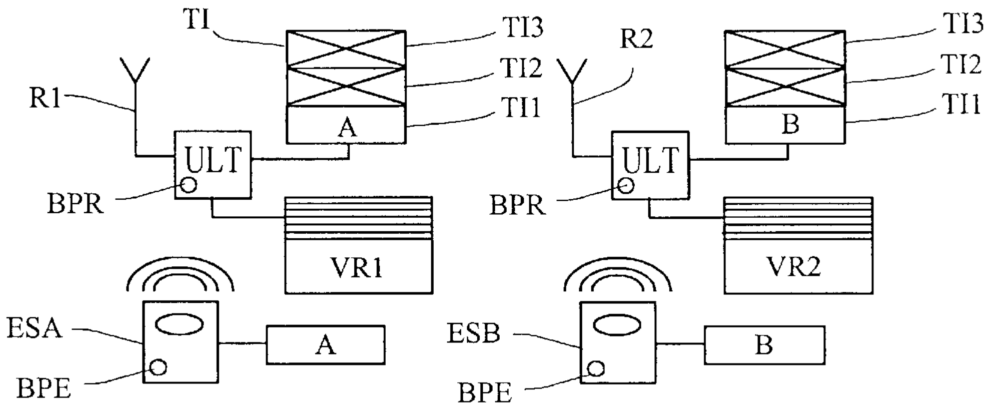
FIG. 1 is a block diagram of an assembly consisting of two simple transmitters and of two receivers.

The assembly represented in FIG. 1 comprises two wave transmitters ESA and ESB each having a unique identity number represented here by the letters A and B. The waves transmitted by these transmitters may be electromagnetic, optical or ultrasonic waves. They are equipped with a transmitter pushbutton BPE whose actuation, by a user, causes the transmission of a signal comprising a frame which contains the identity of the transmitter and a control command. These transmitters are transmitters of simple type, hereinafter dubbed "simple transmitters". This particular feature of the transmitter is signaled by an identifier in the signal frame.

The assembly represented comprises, moreover, two receivers R1 and R2 each equipped with a ULT (logic processing unit) and an identity table TI comprising a certain number of memory slots T11, T12, T13, etc. The ULT comprises a processor, a ROM memory, an EPROM memory, inputs and outputs like the ULT described in patent FR 2 761 183. The EPROM memory is used as identity table. The receivers are furthermore equipped with a receiver pushbutton BPR. Via an interface, each of the ULTs controls, in the example considered, the motor of a roller blind VR1, respectively VR2. Each receiver is capable of extracting from the wave transmitted by a transmitter the frame composed of the identity number of the transmitter and of its identifier characterizing it as a simple transmitter.

The pushbutton BPR makes it possible to place the processor of the receiver into recording mode when the receiver is first brought into service, when no transmitter identity number has yet been placed in memory in the identity table.

As in the case of the device described in the patent FR 2 761 183, the processor of each of the receivers is programmed to compare the identity number of the transmitter received with the numbers stored in the identity table and, should the numbers match, to execute the command received, that is to say the raising or lowering of the roller blind. If the command received matches the code of a pushbutton BPE, the processor is then placed in recording mode, in which it is capable of recording a transmitter identity number in the identity table or of erasing it from this table if the identity number of the transmitter is already contained in the identity table.

It is initially assumed that the identity tables are empty. If, for example, the receiver R1 receives a signal from the transmitter ESA it records the identity A of this transmitter in the first slot TI1 of its identity table. The ULT having moreover identified the transmitter as a simple transmitter, it locks the other slots of the identity table, preventing the recording of other identity numbers of transmitters. Likewise for the transmitter ESB whose identity B is recorded in the first slot of the identity table of the receiver R2. Thus, each transmitter controls only a single receiver.

Figure 2:
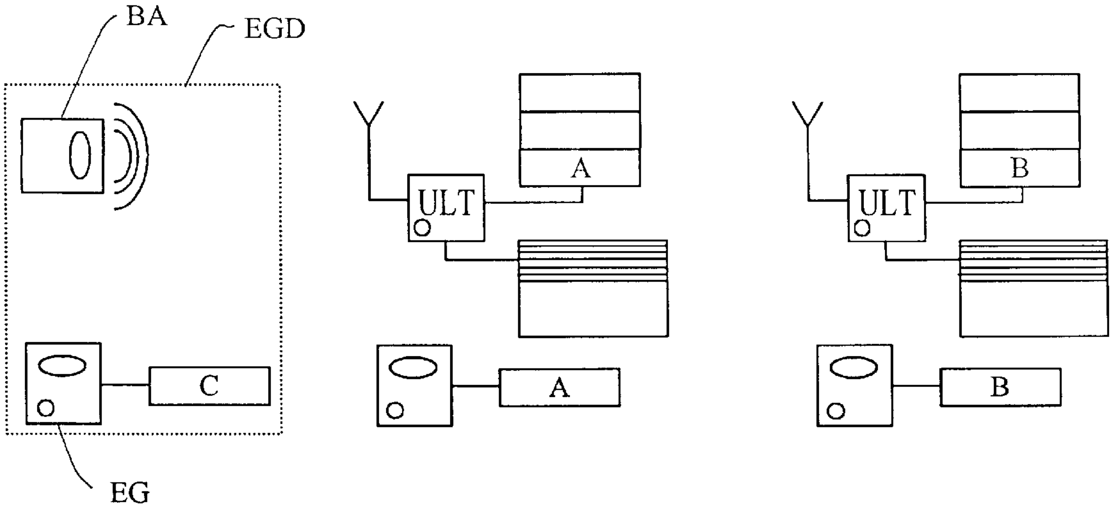
FIG. 2 represents the block diagram of the same assembly supplemented with a general control transmitter, during the transmitting of a signal by the auxiliary box of this general control transmitter.
Figure 3:
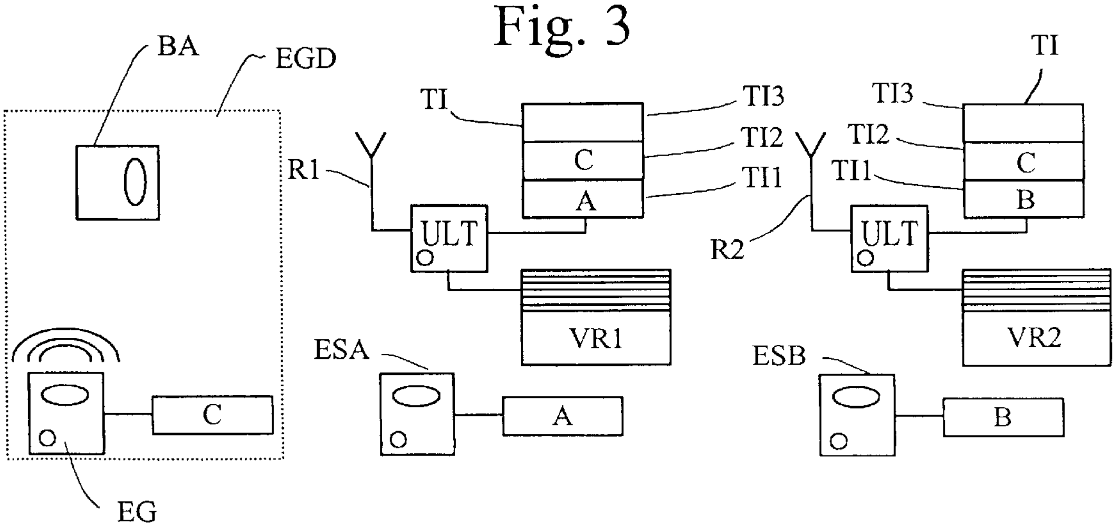
FIG. 3 represents the assembly of FIG. 2 after recording the identity number of the general control transmitter in the memories of the receivers.

One may however desire to modify the installation so as to be able to carry out a general control, that is to say to control a receiver from several transmitters. FIGS. 2 and 3 illustrate this modification.

The assembly is supplemented with a general transmitter EG having an identity number C. With this general transmitter EG there is associated an auxiliary box BA containing a transmitter. The general transmitter EG and the box BA can be accommodated in a common box so as to constitute an enabler general transmitter EGD.

By means of the auxiliary box BA, it is possible to transmit a signal containing a control frame bringing about the freeing of the other slots TI2, TI3, etc. of the identity tables of the receivers.

This operation having been performed, the identity number C of the general transmitter EG can be recorded in the identity tables of the two receivers, as is represented in FIG. 3. The general transmitter EG can be a simple transmitter or a standard transmitter such as described in the patent FR 2 761 183. The addresses of the simple transmitters are preserved.

Figure 4:
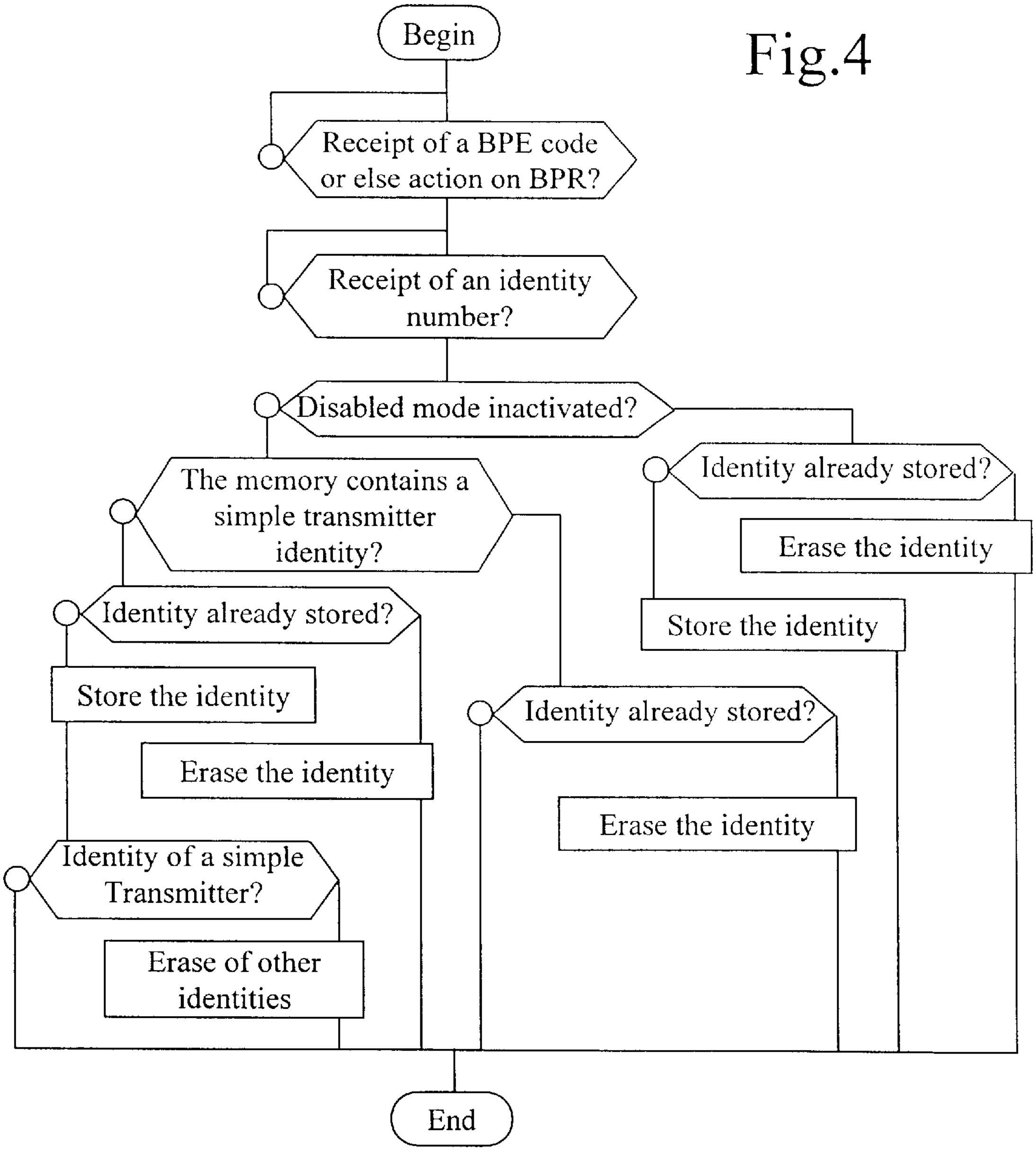
FIG. 4 represents the flowchart of the procedure for storing or for erasing an identity number of a transmitter in the memory of a receiver.
Figure 5:
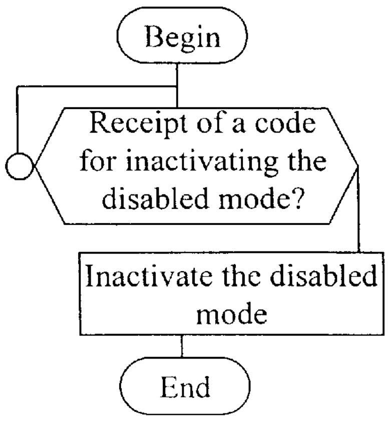
FIG. 5 represents the flowchart of the procedure for inactivating the routine for testing the type of transmitter.

The procedure for recording or for erasing the identity number of a transmitter is represented in FIG. 4. The procedure for freeing the slots TI1, TI2, etc. of the identity tables is represented in FIG. 5. This procedure corresponds to an enabling.

During first installation, the identity tables of the receivers are empty and the receivers are still accessible, since they have not been enclosed in a housing or in a ceiling well, for example. An action, by a user, on the pushbutton BPR of a receiver puts the processor of the ULT of this receiver into recording mode, thereby triggering a timeout during which the identity number of a transmitter is awaited. If no transmitter has shown itself by the transmitting of a frame containing an identity number during this timeout, the procedure terminates and the processor returns to operational mode.

If, on the other hand, the frame of a transmitter is received by the receiver, the latter extracts the identity number of the actuated transmitter from the frame.

The processor then tests whether a command for enabling the slots of the identity tables has been received from an auxiliary box B.A. In the flowchart of FIG. 4, this test is called "inactivated disabled mode".

If this test is negative, the processor tests whether the identity table (memory) already contains a simple transmitter identity number. If it does, a test is performed as to whether this identity is already stored. In the affirmative, this identity is erased from the table. This can occur when reconfiguring an installation or in the event of a change of transmitter. After erasure, the receiver, once installed, will be able to record the identity of a simple transmitter.

If the "the memory contains a simple transmitter identity?" test is negative, the processor tests whether an identity number is already stored in the identity table. In the affirmative, it erases this identity number. In the negative, the identity number is stored in the identity table.

The processor then tests whether this identity number is that of a simple transmitter. In the affirmative, all the other identity numbers are erased from the identity table in which there then remains just one simple transmitter identity number. In the negative, any other identity numbers which may be stored in the identity table are preserved.

In parallel and simultaneously with the procedure according to FIG. 4 the procedure represented in FIG. 5 is run. The processor tests whether the frame of the signal received contains a code for inactivating the disabled mode. In the affirmative, it instructs the inactivation of the disabled mode.

Coming back to the procedure of FIG. 4, if the processor tests that the disabled mode is deactivated, it then tests whether the identity number received is already stored in the identity table. In the affirmative, it erases this identity number. In the negative, it stores this identity in a free slot of the identity table.

A variant of the procedure of FIG. 5 consists in systematically erasing the identity of the simple transmitter already stored upon receipt of a code for inactivating the disabled mode. It is then necessary to replace the simple transmitters by transmitters whose frame does not contain an identifier signifying that this transmitter may control a single receiver only. Such for example is the case of a general transmitter, or else of an individual transmitter.

This process applies equally to group control or multiple control identity learning.

Although illustrative embodiments of the invention have been shown and described, a wide range of modification, change and substitution is contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. An assembly comprising at least one device remotely controlled by at least one transmitter (ESA, ESB) possessing an identity number, the transmitter capable of transmitting a signal consisting of a frame containing the identity number (A, B) and a command, a receiver (R1, R2) associated with the remotely controlled device (VR1, VR2) and capable of extracting the identity number and the command from the signal received, this receiver containing a logic processing unit (ULT) comprising a memory (TI) intended for storing at least one identity number, a processor containing a recording program ensuring, on receiving an identity number, the storing of the identity number received, this processor being able to work in an operational mode in which it compares the identity number received with the identity number contained in the memory so as to execute the command received when the identity number received corresponds to an identity number contained in the memory and a recording mode in which it is able to ensure the recording of the identity number of the transmitter in the memory, the transmitter and the receiver comprising associated means (BPE, BPR) for placing the processor in recording mode, wherein at least one transmitter of the assembly is a transmitter of simple type (ESA, ESB), that is to say a transmitter whose signal frame contains an identifier signifying that this transmitter may control only a single receiver, and wherein the program contained in the processor of at least one receiver contains a routine for testing and for identifying the type of transmitter preventing the recording of additional transmitter identity numbers in the memory if the identity number identified is that of a transmitter of simple type.

2. The assembly as claimed in claim 1 comprising several transmitters of simple type and several receivers, which assembly comprises at least one auxiliary remote control box (BA) associated with at least one transmitter (EG), this auxiliary box making it possible to transmit a control signal whose reception by the receiver has the effect of deactivating the said routine and consequently of authorizing the recording of additional transmitter identity numbers in the memory in such as a way as to allow the recording of an identity number of a transmitter used as general control transmitter, and wherein the program contained in the processor of the receivers contains a routine for testing the reception of a signal emanating from an auxiliary box, deactivating the said routine on receiving such a signal.

3. The assembly as claimed in claim 1, wherein the processor tests whether the identity number received is already recorded in the memory and, in the affirmative, erases this identity number.

4. The assembly as claimed in claim 2, wherein the processor tests whether the identity number received is already recorded in the memory and, in the affirmative, erases this identity number.

5. The assembly as claimed in claim 2, wherein the deactivating of the routine is accompanied by the erasing of the identity number of the simple transmitter recorded in the memory.

* * * * *